United States Patent
Mizutani et al.

(10) Patent No.: US 9,699,887 B2
(45) Date of Patent: Jul. 4, 2017

(54) CIRCUIT BOARD AND ELECTRONIC DEVICE

(71) Applicant: FUJITSU LIMITED, Kawasaki-shi, Kanagawa (JP)

(72) Inventors: Daisuke Mizutani, Sagamihara (JP); Kenichi Kawai, Yokohama (JP); Takahito Takemoto, Kawasaki (JP); Masateru Koide, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 318 days.

(21) Appl. No.: 14/200,424

(22) Filed: Mar. 7, 2014

(65) Prior Publication Data
US 2014/0293566 A1 Oct. 2, 2014

(30) Foreign Application Priority Data
Mar. 28, 2013 (JP) .................. 2013-067954

(51) Int. Cl.
*H05K 1/02* (2006.01)
*H05K 1/11* (2006.01)

(52) U.S. Cl.
CPC ......... *H05K 1/0216* (2013.01); *H05K 1/0222* (2013.01); *H05K 1/0251* (2013.01); *H01L 2224/16* (2013.01); *H01L 2924/15174* (2013.01); *H01L 2924/15311* (2013.01); *H05K 1/0228* (2013.01); *H05K 1/0231* (2013.01); *H05K 1/115* (2013.01); *H05K 2201/10734* (2013.01)

(58) Field of Classification Search
CPC ... H05K 1/0216; H05K 1/0222; H05K 1/0251

USPC .......................... 361/774; 174/250
See application file for complete search history.

(56) References Cited

U.S. PATENT DOCUMENTS 6,479,758 B1* 11/2002 Arima ............... H01L 23/49838
174/260
7,038,319 B2* 5/2006 Buffet .................. H01L 23/642
257/665

(Continued)

FOREIGN PATENT DOCUMENTS

JP 2001-203470 A1 7/2001
JP 2005-072581 A 3/2005

(Continued)

OTHER PUBLICATIONS

Extended European Search Report of corresponding EPC Application No. 14160209.4 dated Jan. 4, 2016.

(Continued)

*Primary Examiner* — William H Mayo, III
*Assistant Examiner* — Hiram E Gonzalez
(74) *Attorney, Agent, or Firm* — Kratz, Quintos & Hanson, LLP

(57) ABSTRACT

A circuit board includes a substrate, a first ground electrode group, and a first pair of signal electrodes. The first ground electrode group includes a plurality of first ground electrodes, where each of the plurality of the first ground electrodes is disposed at a corresponding one of vertexes of a first rectangular area in a surface of the substrate. the first pair of signal electrodes is disposed in the first rectangular area and is arranged in a first direction parallel to a side of the first rectangular area.

16 Claims, 18 Drawing Sheets

(56) References Cited

U.S. PATENT DOCUMENTS

| | | | |
|---|---|---|---|
| 7,335,976 B2* | 2/2008 | Chen | H01L 23/5222 |
| | | | 257/690 |
| 7,863,526 B2* | 1/2011 | Audet | H01L 23/49822 |
| | | | 174/261 |
| 8,476,537 B2* | 7/2013 | Kushta | H05K 1/0251 |
| | | | 174/262 |
| 8,748,753 B2* | 6/2014 | Lam | H05K 1/0245 |
| | | | 174/260 |
| 2004/0041277 A1 | 3/2004 | Kimura et al. | |
| 2005/0040536 A1 | 2/2005 | Buffet et al. | |
| 2005/0201065 A1 | 9/2005 | Regnier | |
| 2010/0282503 A1 | 11/2010 | Kushta | |
| 2012/0247825 A1* | 10/2012 | Wei | H05K 1/0222 |
| | | | 174/266 |
| 2014/0049929 A1* | 2/2014 | Yamaguchi | H05K 1/0216 |
| | | | 361/782 |

FOREIGN PATENT DOCUMENTS

| | | |
|---|---|---|
| JP | 2007-522678 A1 | 8/2007 |
| JP | 2010-192767 A1 | 9/2010 |
| JP | 2010-538446 A | 12/2010 |

OTHER PUBLICATIONS

Office Action of corresponding Japanese Patent Application No. 2013-067954 dated Nov. 8, 2016; machine translation of Office Action.

* cited by examiner

CIRCUIT BOARD AND ELECTRONIC DEVICE

CROSS-REFERENCE TO RELATED APPLICATION

This application is based upon and claims the benefit of priority of the prior Japanese Patent Application No. 2013-067954, filed on Mar. 28, 2013, the entire contents of which are incorporated herein by reference.

FIELD

The embodiment discussed herein is related to a circuit board and an electronic device.

BACKGROUND

Circuit boards on which various components are mounted have been widely used for electronic devices. For example, it has been known that an electronic device (a semiconductor package) includes a circuit board (a package substrate) on which a semiconductor element is mounted, or an electronic device includes a circuit board, such as a mother board, on which a semiconductor package is mounted. As the operation speed of electronic devices has increased, a differential transmission type circuit board as a circuit board has been used, signals in the differential transmission type circuit are transmitted through a pair of transmission paths.

Japanese Laid-open Patent Publication No. 2001-203470 and Japanese Laid-open Patent Publication No. 2010-192767 are reference documents.

SUMMARY

According to an aspect of the invention, a circuit board includes a substrate, a first ground electrode group that includes a plurality of first ground electrodes, each of the plurality of the first ground electrodes being disposed at a corresponding one of vertexes of a first rectangular area in a surface of the substrate, and a first pair of signal electrodes disposed in the first rectangular area, the pair of the signal electrodes being arranged in a first direction parallel to a side of the first rectangular area.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

In a circuit board which transmits signals in the circuit board or to outside the circuit board using a pair of transmission paths (wires in the circuit board and signal electrodes provided on a surface of the circuit board so as to be electrically connected to the wires and joined to another component), decrease of crosstalk between transmission paths of a different pair is desired.

Figure 1:
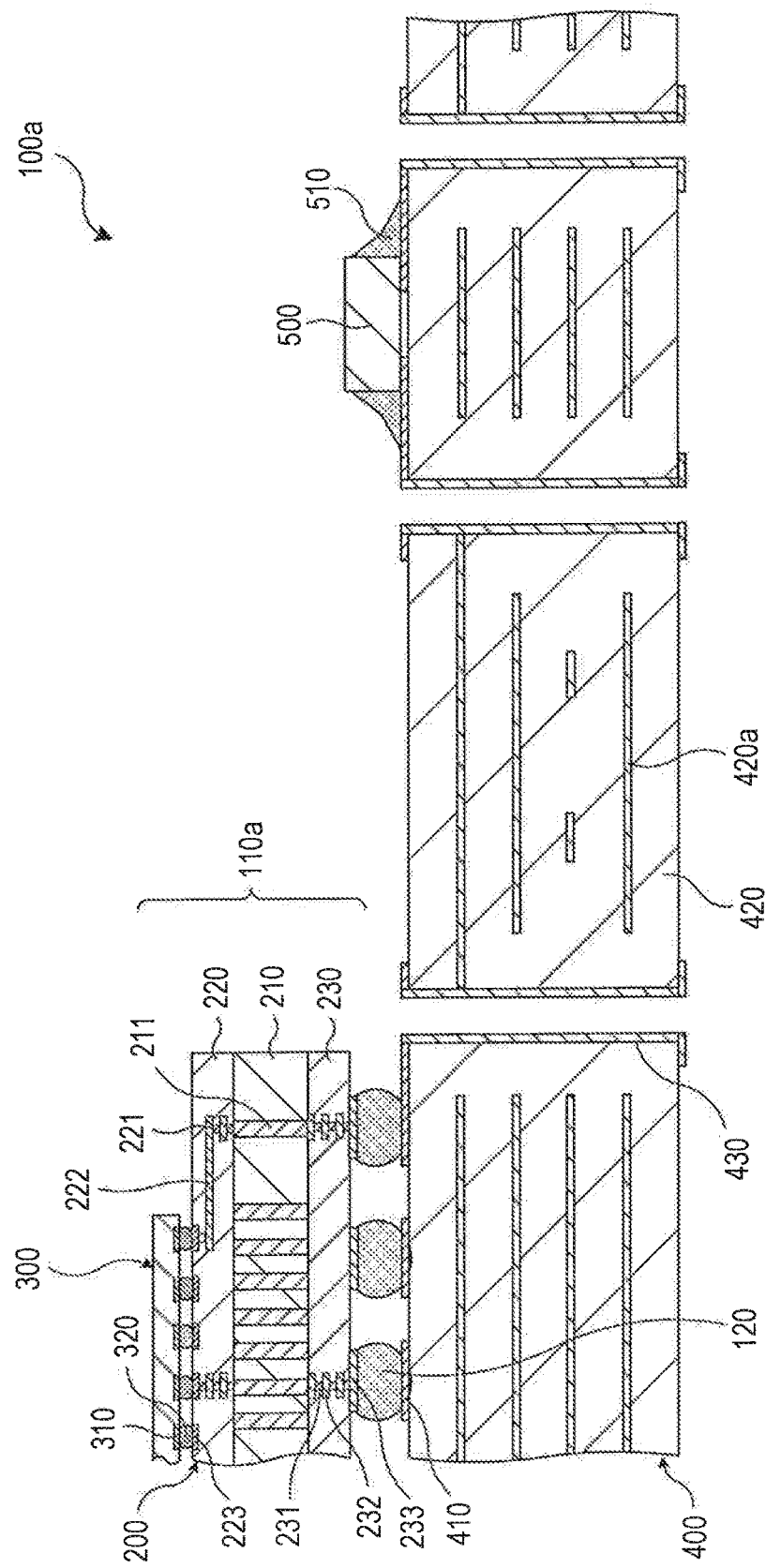
FIG. 1 is a diagram illustrating an example electronic device.

FIG. 1 is a diagram illustrating an example electronic device. Specifically, FIG. 1 is a cross-sectional view illustrating a major part of an example electronic device. An electronic device 100a illustrated in FIG. 1 includes a package substrate (a circuit board) 200, a semiconductor element 300 mounted on the package substrate 200, and a mother board (a circuit board) 400 connected to the package substrate 200 on which the semiconductor element 300 is mounted.

The package substrate 200 is, for example, a build-up circuit board, and includes a core layer 210, and wire layers 220 and 230 formed on front and back surfaces of the core layer 210 using a build-up technology.

A through hole via 211 is provided in the core layer 210 of the package substrate 200. A via 221 and a wire 222 are provided in a wire layer 220 provided on one side of the core layer 210 so as to be electrically connected to the through hole via 211 of the core layer 210, and an electrode 223 is provided on a surface of the wire layer 220 so as to be located in a position corresponding to an electrode 310 of the semiconductor element 300. A via 231 and a wire 232 are provided in a wire layer 230 provided on the other side of the core layer 210 so as to be electrically connected to the through hole via 211 of the core layer 210, and an electrode 233 is provided on a surface of the wire layer 230 so as to be located in a position corresponding to an electrode 410 of the mother board 400.

The semiconductor element 300 is mounted on the package substrate 200 configured in the above-described manner. The electrode 310 of the semiconductor element 300 and the electrode 223 of the package substrate 200 are joined together via a bump 320, and thus, the semiconductor element 300 is mounted on the package substrate 200. Thus, the semiconductor element 300 is mounted on the package substrate 200 to form a semiconductor package 110a.

The electrode 233 of the package substrate 200 of the semiconductor package 110a is connected to the electrode 410 of the mother board 400 via a bump 120, and thus, the semiconductor package 110a is mounted on the mother board 400. For example, a laminated body of prepreg 420 may be used as the mother board 400, where the laminated body of prepreg 420 includes a conductor pattern 420a provided on both of front and back surfaces thereof, or the front surface or the back surface thereof may. Performing a hole-forming process to the laminated body prepreg 420 to form a hole and forming a conductive film in the hole, a through hole 430 is formed so that the front surface of the mother board 400 is electrically connected to the back surface thereof.

When a relatively high frequency signal is transmitted in the electronic device 100a, an alternating current (AC) coupling capacitor 500 is provided on a transmission path through which the relatively high frequency signal is transmitted. FIG. 1 illustrates as an example a case where an AC coupling capacitor 500 is bonded, via a solder 510, to a transmission path of the mother board 400 through which the relatively high frequency signal is transmitted.

Incidentally, some of the electronic device may use a circuit board, in which transmits a relatively high frequency signal, including a pair of transmission paths (pair transmission paths) through which a signal is transmitted by a differential transmission method. In such a circuit board, there is a probability that crosstalk (an electromagnetic interference) occurs between different pairs of transmission paths. One of methods for reducing crosstalk is to provide an electromagnetic shielding structure using a conductor body at a ground potential between the different pairs of transmission paths in the circuit board. On the other hand, signal electrodes extended from the pair transmission paths are exposed on a surface of the circuit board, and therefore, crosstalk might occur in a joint part where the signal electrode and an electrode of a component joined to the circuit board are joined together.

Figure 2A:
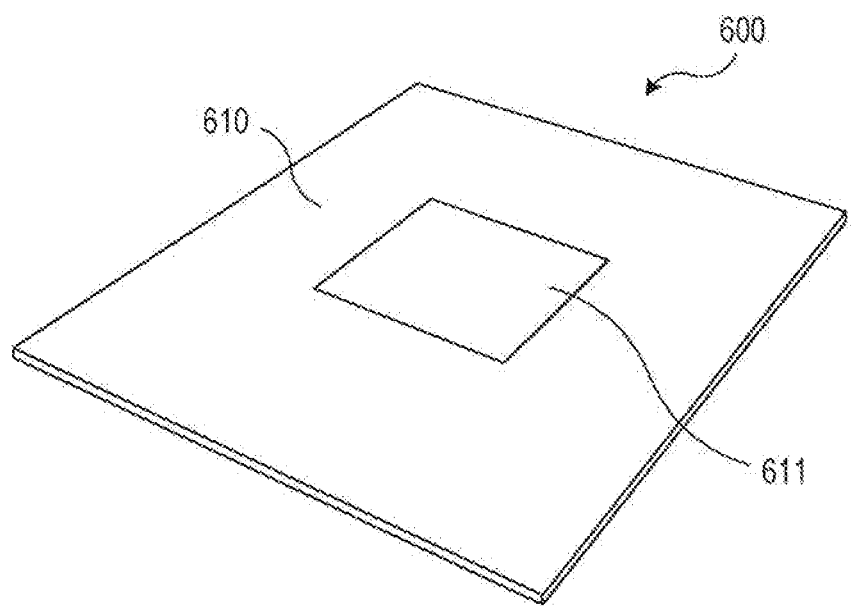
FIGS. 2A-2B are (first) diagrams illustrating an example circuit board.
Figure 2B:
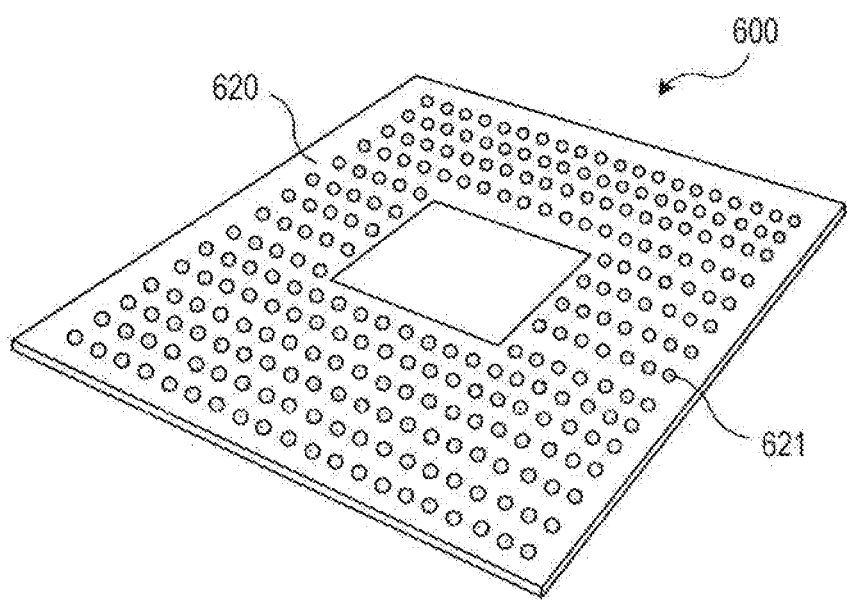

FIGS. 2A-2B, FIG. 3, and FIG. 4 are diagrams illustrating an example circuit board. FIGS. 2A-2B illustrate, as an example circuit board, a package substrate 600 on which a semiconductor element is mounted. On one surface 610 of the package substrate 600 illustrated in FIG. 2A, a mounting area 611 for a semiconductor element is provided. On the other surface 620 of the package substrate 620 illustrated in FIG. 2B, a group of electrodes 621 for electrically coupling the package substrate 600 to another component, for example, a mother board, is provided, where the electrodes 621 are arranged in a latticed pattern in a certain area.

When the package substrate 600 includes the pair transmission paths, the group of electrodes 621 arranged in the latticed pattern as illustrated in FIG. 2B includes signal electrodes extending from pairs of wires (pair wires) provided in the package substrate 600. For example, as illustrated in FIG. 3, the group of electrodes 621 includes pairs of signal electrodes 621a (a single pair is surrounded by a dashed line in FIG. 3) and ground electrodes 621b, and these electrodes are mixedly arranged in the latticed pattern on the surface 620 of the package substrate 600.

Figure 3:
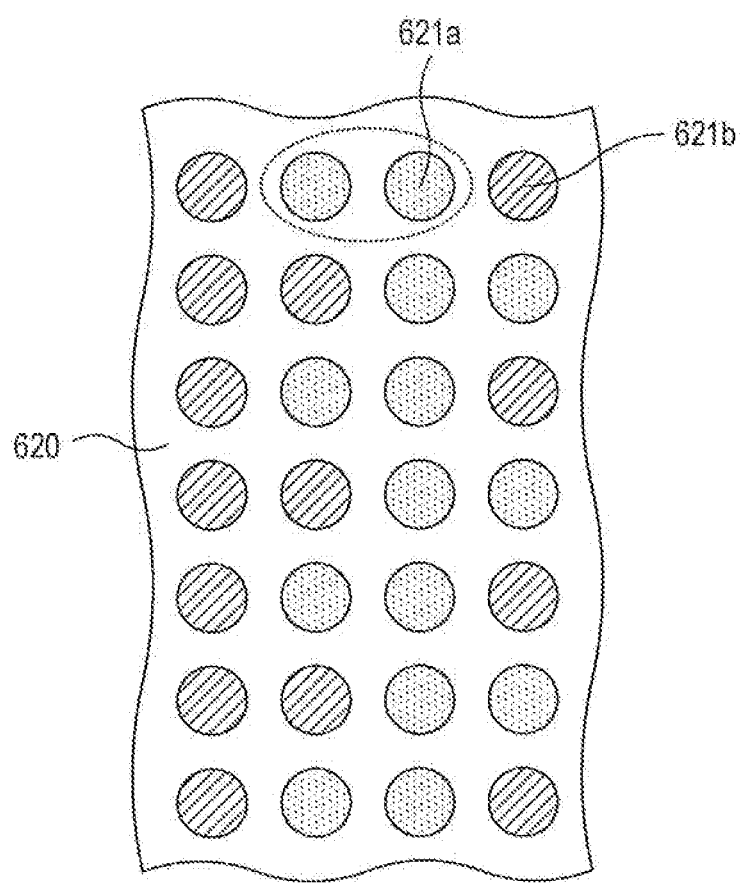
FIG. 3 is a (second) diagram illustrating an example circuit board.

As illustrated in FIG. 3, when different pairs of signal electrodes 621a are disposed so as to be adjacent to one another, crosstalk might occur in the signal electrodes 621a or joint parts where the signal electrodes 621a and electrodes of the mother board are joined together. In order to reduce such crosstalk, for example, as illustrated in FIG. 4, ground electrodes 621b are disposed between the different pairs of signal electrodes 621a (a single pair is surrounded by a dashed line in FIG. 4), and thus, a certain distance is ensured between the different pairs of signal electrodes 621a.

As a result, however, the number of groups of electrodes 621 (including the signal electrodes 621a and the ground electrodes 621b) arranged on the surface 620 of the package substrate 600 is increased, and accordingly, an arrangement area of the group of electrodes 621 is increased. If the number of pins provided in the semiconductor element which is mounted on the electronic device is increased because of the demand for high performance, the number of the groups of electrodes 621 and the arrangement area thereof are increased for the purpose of reducing crosstalk, thus increasing the number of pins provided on the package substrate 600 and the size of the package substrate 600.

On the other hand, in view of increasing the operation speed, in order to reduce a transmission loss which increases as the frequency increases, the group of electrodes 621 is provided with reduced intervals to increase arrangement density, thereby reducing increase in size of the package substrate 600 due to increase in the number of pins and also reducing a wire length.

Figure 4:
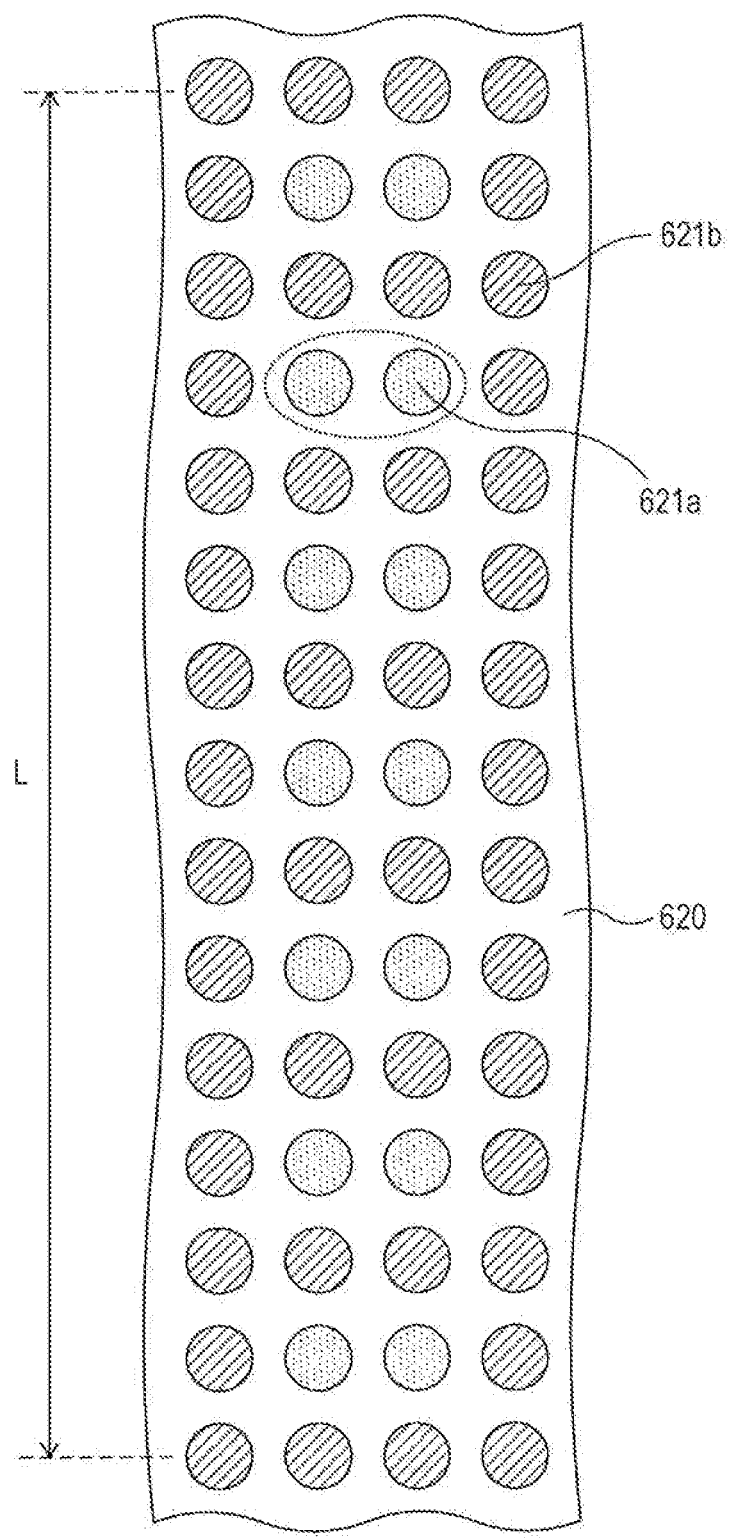
FIG. 4 is a (third) diagram illustrating an example circuit board.

In the electrode arrangement illustrated in FIG. 3, crosstalk is not effectively reduced, and furthermore, in the electrode arrangement illustrated in FIG. 4, although a certain crosstalk reduction effect is achieved, there is a probability that the number of pins provided in the package substrate 600 and the size of the package substrate 600 are increased, the wire length is increased, and thus, transmission loss is increased.

Figure 5:
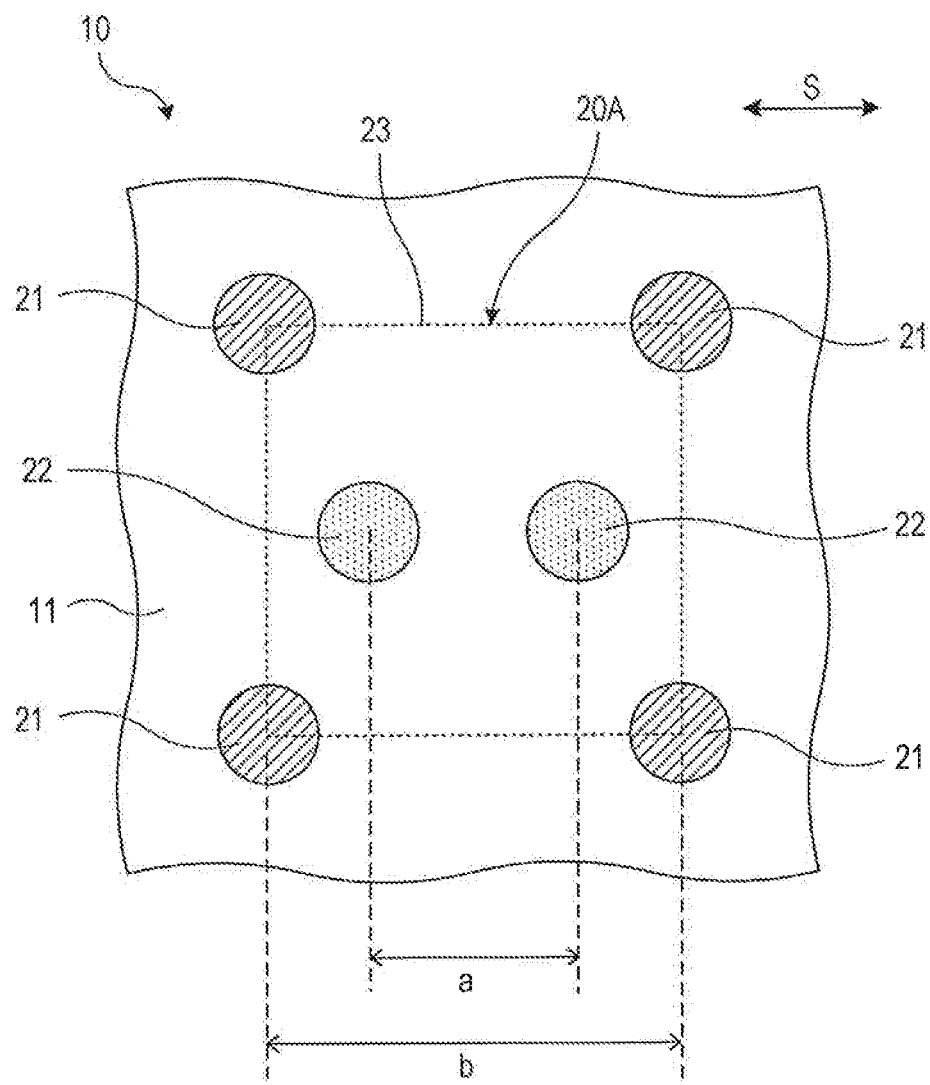
FIG. 5 is a diagram illustrating a first electrode arrangement example.

In view of the foregoing, according to this disclosure, an electrode arrangement illustrated in FIG. 5 is employed for a circuit board, such as a package substrate, and the like. FIG. 5 is a diagram illustrating a first example of electrode arrangement. Specifically, FIG. 5 is a schematic view of an example electrode arrangement in a part of an area of a circuit board.

A circuit board 10 illustrated in FIG. 5 includes, in a part of the surface 11, four ground electrodes 21 disposed at vertexes of a rectangular area 20A indicated by dashed lines and a pair of signal electrodes 22 disposed in the rectangular area 20A and surrounded by the ground electrodes 21.

The circuit board 10 is, for example, a package substrate. Examples of the package substrate include various types of substrate, such as, a build-up substrate, a ceramic substrate, a glass ceramic substrate, a coreless substrate, and the like. A surface 11 of the circuit board 10 on which the ground electrodes 21 and the signal electrodes 22 are disposed is, for example, a surface which is joined to another component, such as a mother board, and the like. The ground electrodes 21 are electrodes which have a potential serving as a ground potential of the circuit board 10, and the pair of signal electrodes 22 is electrodes each of which is electrically connected to the corresponding one of pair wires provided in the circuit board 10.

The pair of signal electrodes 22 is arranged in a direction S which is parallel to a side 23 of the rectangular area 20A with an interval a (with a distance (a pitch) a) between respective centers of the pair of signal electrodes 22). The rectangular area 20A has, for example, a square shape. The four ground electrodes 21 are disposed at the vertexes of the rectangular area 20A having a square shape with intervals b (with a pitch b between respective centers of the adjacent ones of the ground electrodes 21) which are greater than the interval a between the pair of signal electrodes 22. The interval b between adjacent two of the ground electrodes 21 is set, for example, to be the double (b=a×2) of the interval a between the signal electrodes 22. Specifically, assuming that the interval a between the signal electrodes 22 is 1 mm, the interval b between adjacent two of the ground electrodes 21 is 2 mm.

Thus, for the circuit board 10 illustrated in FIG. 5, an electrode arrangement is employed in which the pair of signal electrodes 22 disposed in line in the direction S is surrounded by the four ground electrodes 21 disposed at the vertexes of the rectangular area 20A having a square shape. By disposing the electrodes in the electrode arrangement illustrated in FIG. 5, an electromagnetic interference from the pair of signal electrodes 22 to the other signal electrodes or to the pair of signal electrodes 22 from the other signal electrodes, that is, crosstalk, is reduced by the surrounding four ground electrodes 21.

Figure 6:
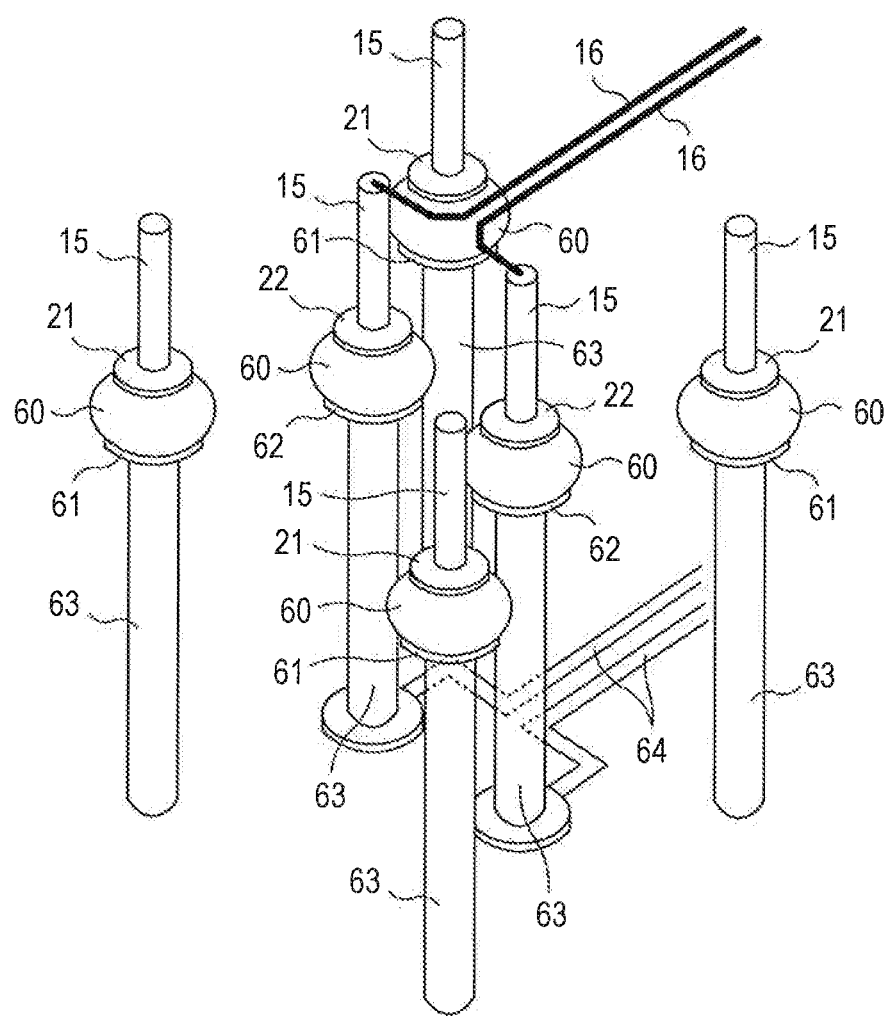
FIG. 6 is a (first) diagram illustrating an example joint part where a circuit board and a component are joined together.

FIG. 6 is a diagram illustrating an example joint part where a circuit board and a component are joined together. Specifically, FIG. 6 is a perspective view schematically illustrating an example joint part where a circuit board and a mother board are joined together. In FIG. 6, the four ground electrodes 21 and the pair of signal electrodes 22 are provided on the surface of the circuit board 10 in the basis of the electrode arrangement illustrated in FIG. 5. Each of vias 15 provided in the circuit board 10 is coupled to the corresponding one of the ground electrodes 21 and the signal electrodes 22. A pair of signal wires (pair wires) 16 provided in the circuit board 10 is connected to the vias 15 connected to the pair of signal electrodes 22.

Each of the ground electrodes 21 and the signal electrodes 22 configured in the above-described manner is joined to the corresponding one of ground electrodes 61 and signal electrodes 62 provided on the surface of the mother board via the corresponding one of bumps 60. Each of the vias 63 provided in the mother board is coupled to the corresponding one of the ground electrodes 61 and signal electrodes 62. Signal wires 64 provided in the mother board are coupled to the vias 63 electrically connected to the signal electrodes 22.

The circuit board 10 including the electrode arrangement illustrated in FIG. 5 is, for example, connected to the mother board in the manner illustrated in FIG. 6. The joint parts where the signal electrodes 22 of the circuit board 10 and the signal electrodes 62 of the mother board are connected together are surrounded by the joint parts where the ground electrodes 21 of the circuit board 10 and the ground electrodes 61 of the mother board are joined together, thus reducing crosstalk in the joint parts where the signal electrodes 22 and the signal electrodes 62 are joined together.

The electrode arrangement illustrated in FIG. 5 may be provided on a plurality of parts of the surface 11 of the circuit board 10.

Figure 7:
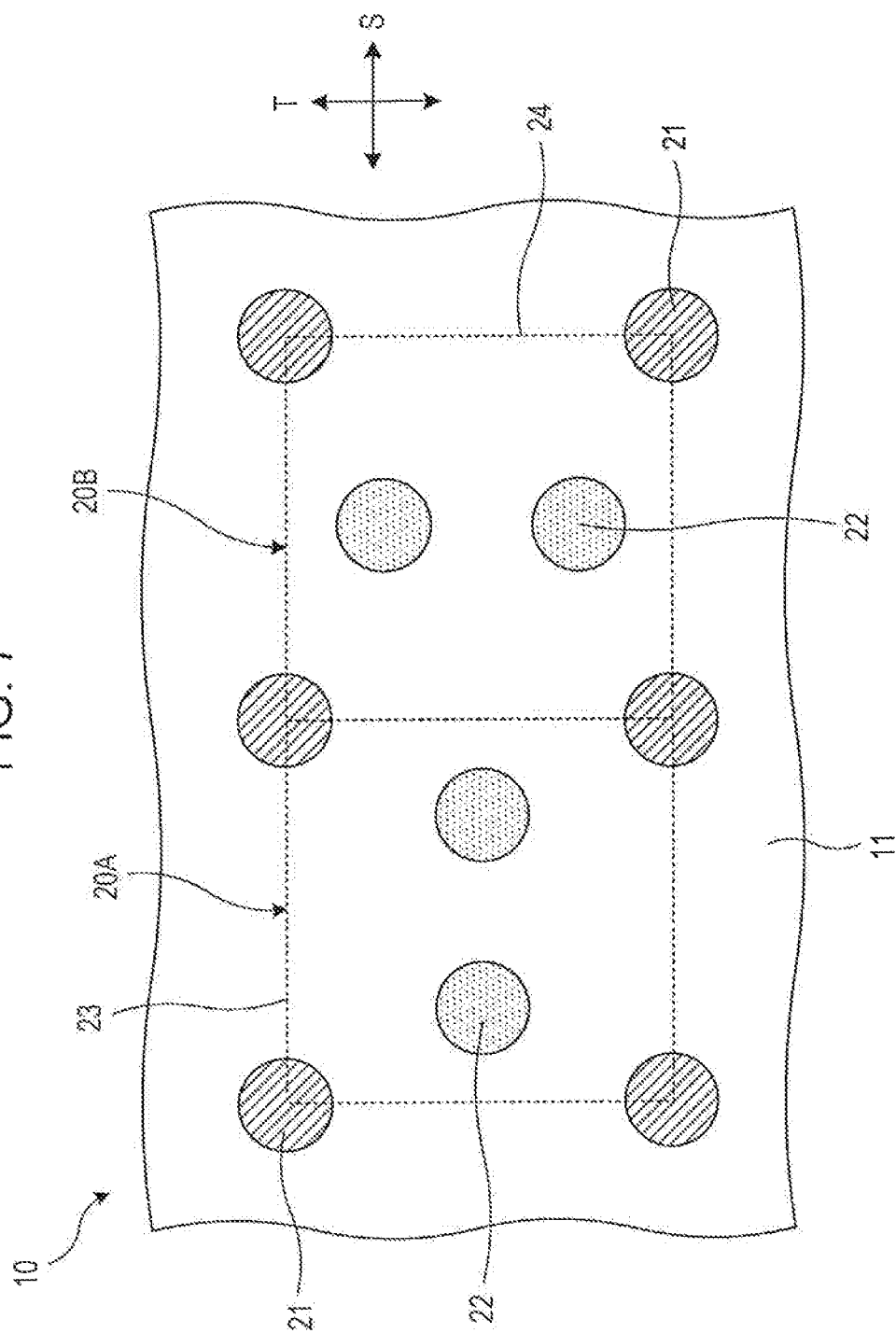
FIG. 7 is a diagram illustrating a second electrode arrangement example.

FIG. 7 is a diagram illustrating a second electrode arrangement example. Specifically, FIG. 7 is a schematic view of an example of an electrode arrangement in an area of a circuit board.

FIG. 7 illustrates, as an example, the circuit board 10 on which the above-described electrode arrangement illustrated in FIG. 5 is provided on two adjacent parts of the surface 11.

The circuit board 10 illustrated in FIG. 7 includes, in the surface 11, the ground electrodes 21 disposed at the vertexes of the rectangular area 20A and the pair of signal electrodes 22 disposed in the rectangular area 20A so as to be arranged in the direction S.

Furthermore, the circuit board 10 illustrated in FIG. 7 includes, in the surface 11, four ground electrodes 21 disposed at vertexes of a rectangular area 20B located adjacent to the rectangular area 20A and a pair of signal electrodes 22 disposed in the rectangular area 20B. The pair of signal electrodes 22 disposed in the rectangular area 20B is arranged in a direction T which is parallel to a side 24 of the rectangular area 20B and is perpendicular to the direction S.

In the example of FIG. 7, on the boundary of the rectangular area 20A and the rectangular area 20B, the pair of ground electrodes 21 disposed in the rectangular area 20A so as to be arranged in the direction T and the pair of ground electrodes 21 disposed in the rectangular area 20B so as to be arranged in the direction T are common.

As illustrated in FIG. 7, the two pairs of signal electrodes 22 are arranged in the direction S and the direction T which are perpendicular to each other, and thus, as compared to the case where the two pairs are arranged in the same direction, the two pairs of signal electrodes 22 may be disposed with an increased distance between the two pairs.

Also, when the electrode arrangement of the latticed pattern illustrated in FIG. 4 is employed for the two pairs of signal electrodes 22, sixteen ground electrodes 21 are provided in order to reduce crosstalk. In contrast, in the electrode arrangement of FIG. 7, only six ground electrodes 21 are enough to reduce crosstalk. That is, using the electrode arrangement illustrated in FIG. 7, reduction in number of electrodes disposed on the surface 11 of the circuit board 10 is achieved.

Figure 8:
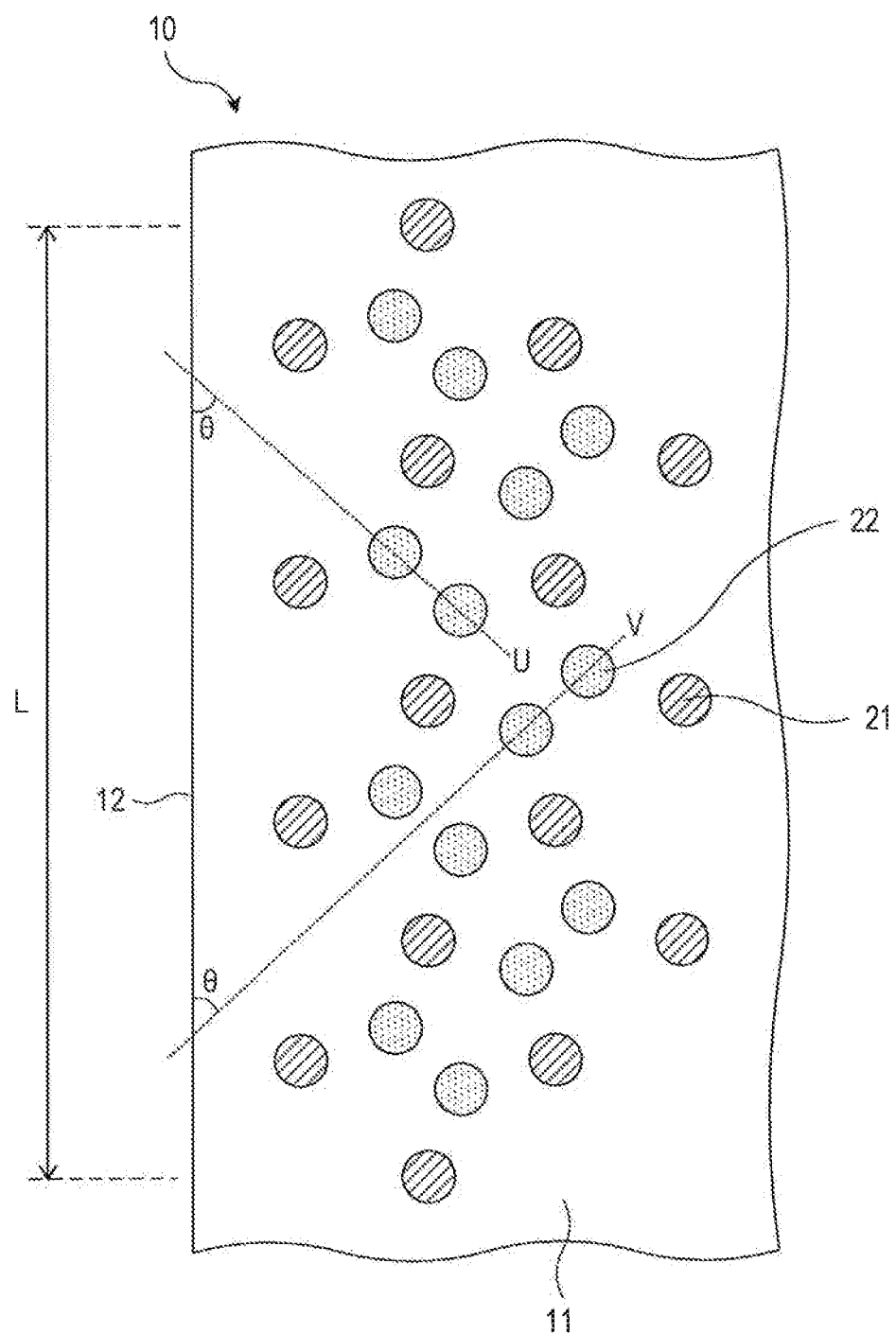
FIG. 8 is a diagram illustrating a third electrode arrangement example.

FIG. 8 is an explanatory diagram illustrating a third electrode arrangement example. Specifically, FIG. 8 is a schematic view of an example electrode arrangement in an area of a circuit board. FIG. 8 illustrates, as an example, the circuit board 10 on which multiple ones of the electrode arrangement illustrated in FIG. 7 are provided in combination on the surface 11 such that some of the pairs of ground electrodes 21 are shared. On the circuit board 10 of FIG. 8, the ground electrodes 21 and the signal electrodes 22 are disposed such that each of the directions (the directions U and V indicated by dashed lines in FIG. 8) in which the pairs of the signal electrodes 22 are arranged is a direction which is neither parallel to an end side 12 of the circuit board 10 nor perpendicular to the end side 12. That is, the ground electrodes 21 and the signal electrodes 22 are disposed on the circuit board 10 such that each of the directions U and V in which the pairs of the signal electrodes 22 are arranged intersects the end side 12 at an acute angle of θ. For example, the ground electrodes 21 and the signal electrodes 22 are arranged such that the directions U and V in which the pairs of the signal electrodes 22 are arranged form an equal angle θ, that is, 45 degrees, with the end side 12 of the circuit board 10.

By arranging the ground electrodes 21 and the signal electrodes 22 as illustrated in FIG. 8, as compared to the electrode arrangement of the latticed pattern illustrated in FIG. 4, it may be achieved to reduce the number of ground electrodes 21 disposed in order to surround a certain number of pairs of signal electrodes 22.

Furthermore, by arranging the ground electrodes 21 and the signal electrodes 22 as illustrated in FIG. 8, it may be achieved to reduce the length of an arrangement area for the ground electrodes 21 and the signal electrodes 22. For example, FIG. 8 illustrates a case where seven pairs of signal electrodes 22 are arranged. In this case, the length L of an electrode arrangement area may be reduced by about 20%, as compared to the case where seven pairs of signal electrodes 621a are arranged as illustrated in FIG. 4.

Figure 9:
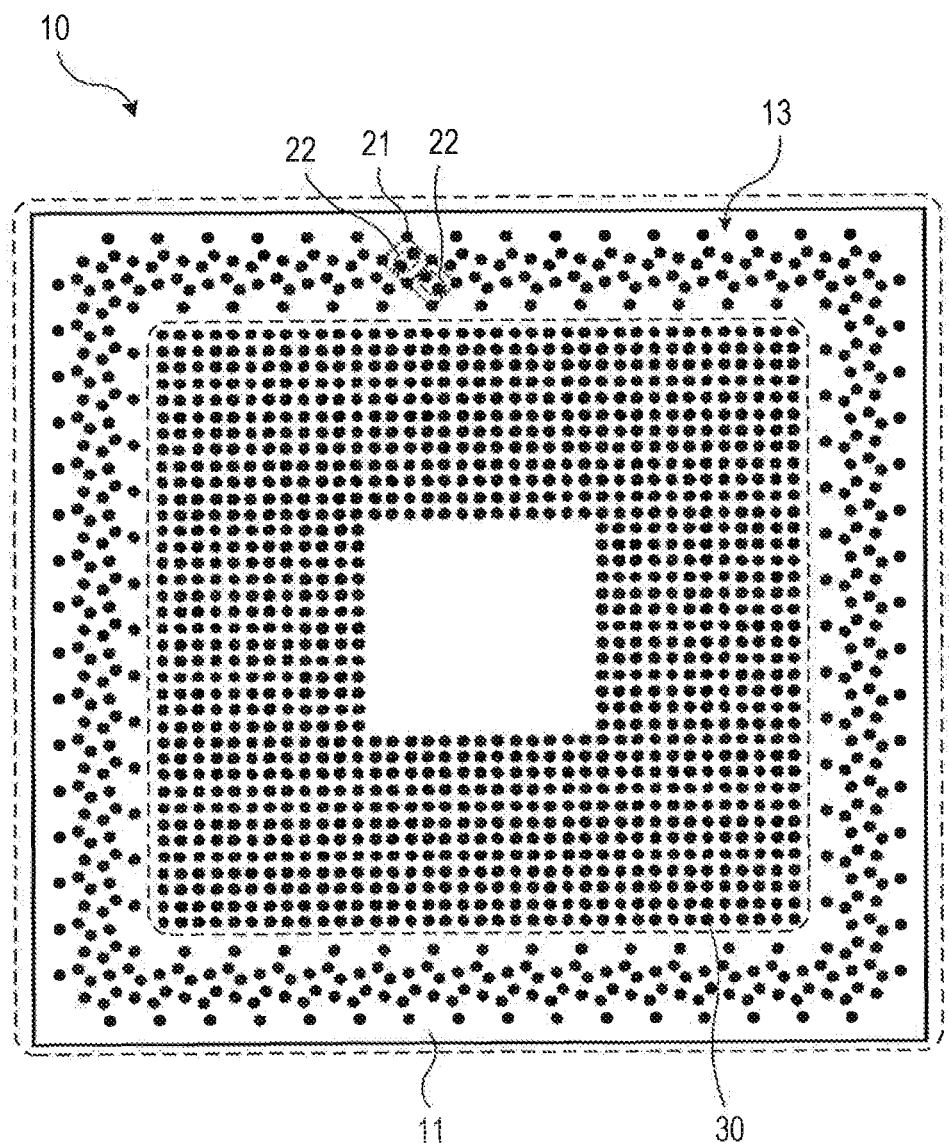
FIG. 9 is a diagram illustrating a fourth electrode arrangement example.

FIG. 9 is an explanatory diagram illustrating a fourth electrode arrangement example. Specifically, FIG. 9 is a schematic plan view of a circuit board viewed from one surface side of the circuit board. FIG. 9 illustrates, as an example, the circuit board 10 on which a plurality of electrodes according to the electrode arrangement illustrated in FIG. 8 is provided in a peripheral part 13 of the surface 11. A group of electrodes 30 is arranged in a latticed pattern in a further inner area than the peripheral part 13 in the circuit board 10.

By arranging pairs of signal electrodes 22 in the peripheral part 13 as in the circuit board 10 illustrated in FIG. 9, it may be reduced to occur a worse situation where wires extended from the pairs of signal electrodes 22 are located close to other electrodes (signal electrodes), and thus, crosstalk may be reduced.

By forming the peripheral part 13 of the circuit board 10 in the electrode arrangement illustrated in FIG. 9, the number of ground electrodes 21 surrounding a certain number of pairs of signal electrodes 22 may be reduced, as compared to the case (FIG. 4) where the signal electrodes 22 and the ground electrodes 21 are arranged in a latticed pattern.

Furthermore, by forming the peripheral part 13 of the circuit board 10 in the electrode arrangement illustrated in FIG. 9, when a certain number of pairs of signal electrodes 22 are provided in the peripheral part 13, the length of the electrode arrangement area may be reduced, as compared to the case (FIG. 4) where the pairs of signal electrodes 22 are arranged in a latticed pattern with the ground electrodes 21.

Using the circuit board 10 illustrated in FIG. 9, it may be achieved to reduce crosstalk in the joint parts where the circuit board 10 and the mother board are joined together via the signal electrodes 22 by the reduced number of the ground electrodes 21 provided around the signal electrodes 22. Furthermore, it may be achieved to reduce the length of the arrangement area in the peripheral part 13 in which the ground electrodes 21 and the signal electrodes 22 are arranged. Accordingly, the overall size of the circuit board 10 may be reduced. The reduction in overall size of the circuit board 10 enables reduction in length of wires extended from the signal electrodes 22, and thus, when the circuit board 10 is used in transmitting a relatively high frequency signal, transmission loss may be reduced.

In the circuit board 10 which includes, in the peripheral part 13, pairs of the signal electrodes 22 and the ground electrodes 21 surrounding them as illustrated in FIG. 9, power supply electrodes (electrodes having a power supply potential or a ground potential) are disposed as electrodes 30 in a further inner area than the peripheral part 13.

Note that, when electrodes for use in transmitting a relatively high frequency signal and electrodes for a relatively low frequency signal are arranged in the circuit board 10, the electrodes for use in transmitting a relatively high frequency signal are disposed as the signal electrodes 22 in the peripheral part 13 and the electrodes for use in transmitting relatively low frequency signals are disposed as the electrodes 30 in a further inner side than the peripheral part 13. As described above, a group of the electrodes 30 located in a central part of the circuit board 10 may include, in addition to the power supply electrode, signal electrodes for use in transmitting signals.

The electrodes 30 may be arranged in a latticed pattern, as illustrated in FIG. 9. In this case, the electrodes 30 are arranged in a latticed pattern with the same intervals as or substantially the same intervals as the interval a between a pair of signal electrodes 22 arranged in the peripheral part 13. By forming the electrode arrangement located in the central part of the circuit board 10 into a lattice pattern, the electrodes 30 may be arranged with higher density in the central part, as compared to the electrode arrangement in the peripheral part 13. By arranging the electrodes 30 in this way, diminution in the total number of electrodes provided on the circuit board 10 may be prevented.

Note that, although FIG. 9 explanatory illustrates a configuration of a non-electrode formation area, in the central part of the surface 11 of the circuit board 10, without forming the group of electrodes 30, the circuit board 10 may be configured such that the electrodes 30 are arranged in a latticed pattern in the central part of the surface 11.

In the above description, using the surface 11 of the circuit board 10 which is joined to the mother board as an example, it has been described to arrange the ground electrodes 21 and the signal electrodes 22, and the electrodes 30. The above-described electrode arrangement illustrated in FIG. 8 may be employed for a surface of the circuit board 10 to which a semiconductor element is joined (mounted).

Figure 10:
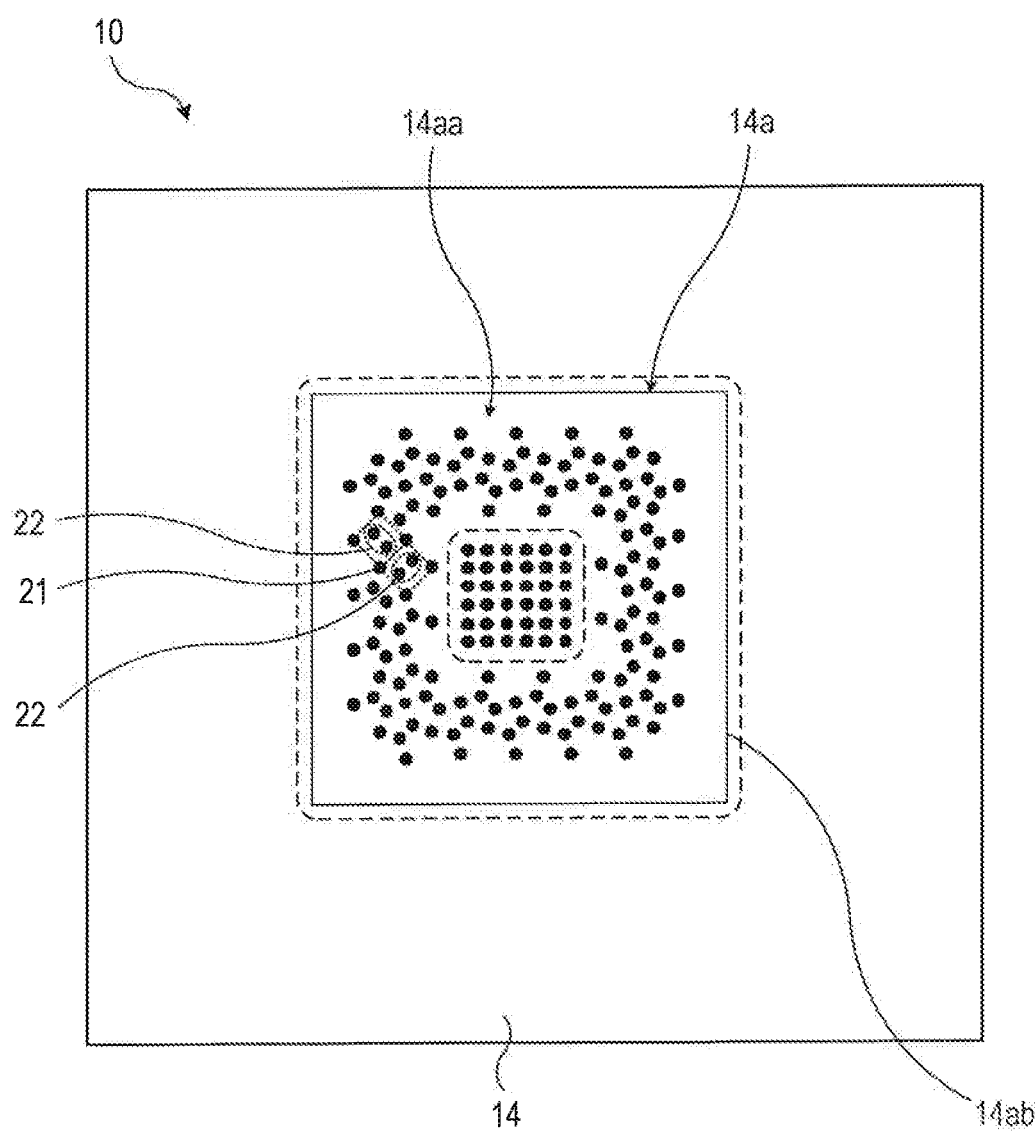
FIG. 10 is a diagram illustrating a fifth electrode arrangement example.

FIG. 10 is a diagram illustrating a fifth electrode arrangement example. Specifically, FIG. 10 is a schematic plan view of a circuit board viewed from the other surface side of the circuit board.

FIG. 10 illustrates as an example a configuration in which the above-described electrode arrangement illustrated in FIG. 8 is employed for a semiconductor element mounting area 14a provided in a surface 14 of the circuit board 10 on which a semiconductor element is mounted.

Similar to FIG. 8, for the mounting area 14a, multiple ones of an electrode arrangement in which a pair of signal electrodes 22 is surrounded by four ground electrodes 21 disposed at vertexes of a rectangular area are provided in combination in a peripheral part 14aa such that some of the pairs of ground electrodes 21 are shared. Adjacent pairs of signal electrodes 22 are arranged such that the direction in which one of the adjacent pairs of signal electrodes 22 is perpendicular to the direction in which the other one of the adjacent pairs. The pairs of signal electrodes 22 are disposed in the mounting area 14a such that the direction in which each pair is arranged forms an equal angle (45 degrees) with an end side 14ab of the mounting area 14a.

Power supply electrodes and signal electrodes for use in transmitting relatively low frequency signals may be provided in a further inner area than the peripheral part 14aa in the mounting area 14a so as to be arranged in a latticed pattern.

By employing the electrode arrangement illustrated in FIG. 10 for the semiconductor element mounting area 14a, the number of the ground electrodes 21 provided around the signal electrodes 22 may be reduced, thus, enabling reduction of crosstalk in the joint parts where the circuit board 10 and the semiconductor element are joined together via the signal electrodes 22. Furthermore, by using the electrode arrangement illustrated in FIG. 10, the size of the mounting area 14a may be reduced, and the length of each wire provided in the circuit board 10 may be reduced.

Subsequently, simulations of possible crosstalk which might occur when the above-described electrode arrangements are employed will be described.

Figure 11:
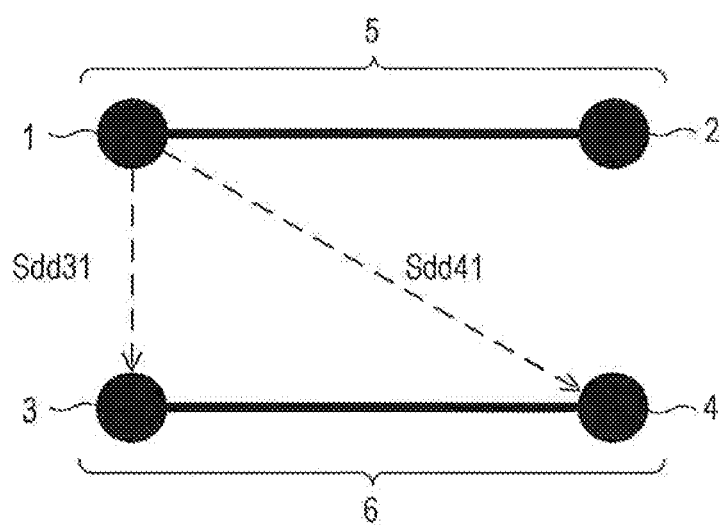
FIG. 11 is a diagram illustrating simulation of crosstalk.
Figure 12:
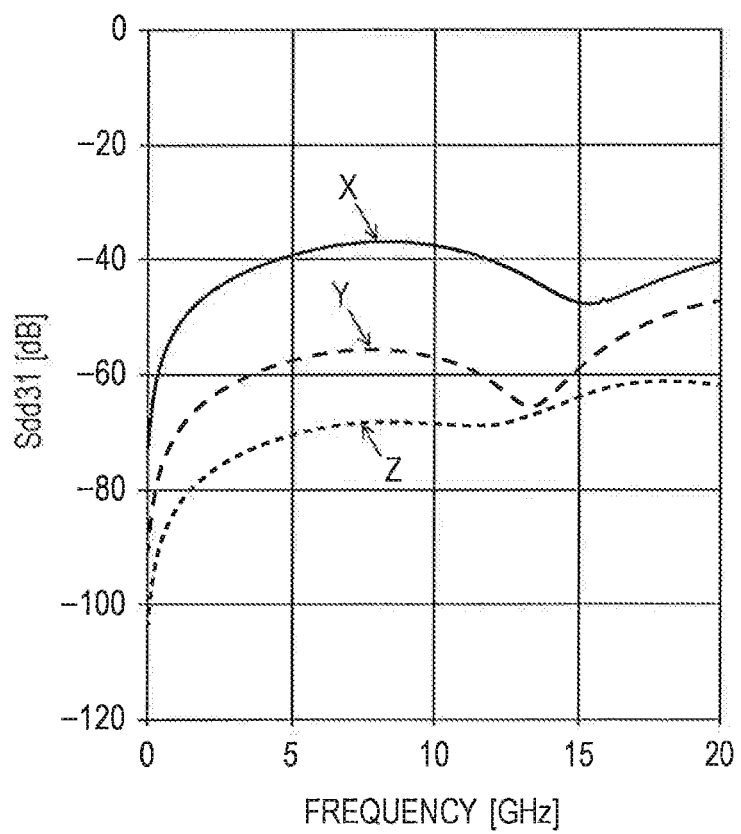
FIG. 12 is a (first) graph illustrating an example simulation result.
Figure 13:
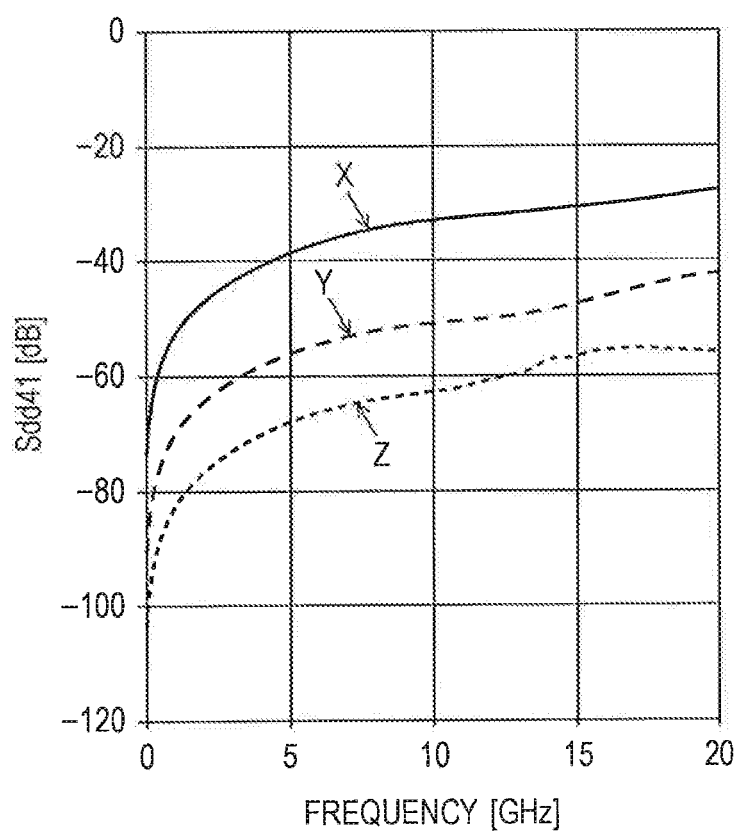
FIG. 13 is a (second) graph illustrating an example simulation result.

FIG. 11 is a diagram illustrating a simulation of crosstalk, and FIG. 12 and FIG. 13 are graphs illustrating example simulation results.

In the simulation, as illustrated in FIG. 11, assuming that a transmission path between a port 1 and a port 2 is a reference transmission path 5 and a transmission path between a port 3 and a port 4 is an evaluation target transmission path 6, crosstalk which the evaluation target transmission path 6 receives from the reference transmission path 5 is evaluated. The transmission path 5 and the transmission path 6 are joint parts (joint parts of different pairs) where the signal electrodes 22 (which correspond to the port 1 and port 3) of the circuit board 10 and electrodes (which correspond to the port 2 and the port 4) of a component, such as a mother board, are joined together. In the simulation, as crosstalk, a near-end crosstalk (Sdd31) between the port 1 and the port 3 and a far-end crosstalk (Sdd41) between the port 1 and the port 4 are evaluated.

FIG. 12 and FIG. 13 illustrate an example of the relationship between a transmission signal frequency [GHz] obtained by the simulation and the near-end crosstalk Sdd31 [dB] and an example of the relationship between the transmission signal frequency [GHz] and the far-end crosstalk Sdd41 [dB], respectively. Each of FIG. 12 and FIG. 13 indicates a result X obtained when the electrode arrangement of FIG. 3 was employed for the transmission path 5 and the transmission path 6, a result Y obtained when the electrode arrangement of FIG. 4 was employed for the transmission path 5 and the transmission path 6, and a result Z obtained when the electrode arrangement of FIG. 8 was employed for the transmission path 5 and the transmission path 6.

It is understood from FIG. 12 and FIG. 13 that the near-end crosstalk Sdd31 and the far-end crosstalk Sdd41 may be reduced by employing the electrode arrangement of FIG. 4 for the electrode arrangement of FIG. 3 (the result X and Y). It is also understood from FIG. 12 and FIG. 13 that, when the electrode arrangement of FIG. 8 is employed, the near-end crosstalk Sdd31 and the far-end crosstalk Sdd41 may be further reduced, as compared those when the electrode arrangement of FIG. 4 is employed (the result Y and Z).

Using the electrode arrangement of FIG. 8, in addition to the above-described advantages, such as reduction in the number of the ground electrodes 21, reduction in the length of an electrode arrangement area, and the like, an excellent crosstalk reduction effect may be advantageously achieved. The circuit board 10 including an electrode arrangement which enables reduction of crosstalk in joint parts where the circuit board 10 and a component, such as a mother board and a semiconductor element has been described above. In an electronic device including a transmission path through which a relatively high frequency signal is transmitted using the circuit board 10, there are cases where, in order to cut low frequency noise, an AC coupling capacitor is provided on such a transmission path through which a high frequency signal is transmitted. The AC coupling capacitor may be mounted not only on the circuit board 10 but also on a mother board joined to the circuit board 10, as long as the AC coupling capacitor is provided on a transmission path through which a high frequency signal is transmitted in the electronic device.

Figure 14:
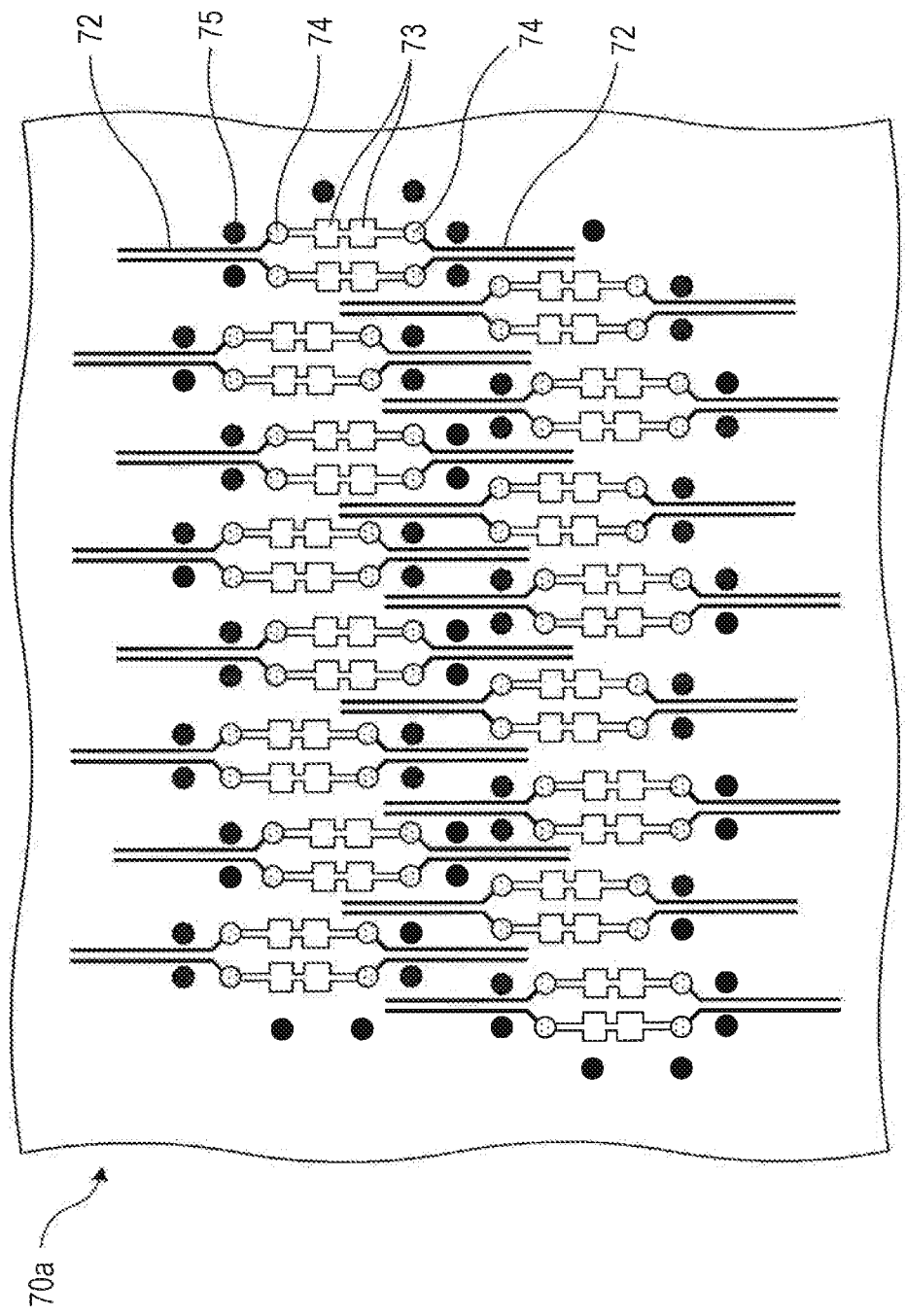
FIG. 14 is a (first) diagram illustrating an example mother board.
Figure 15:
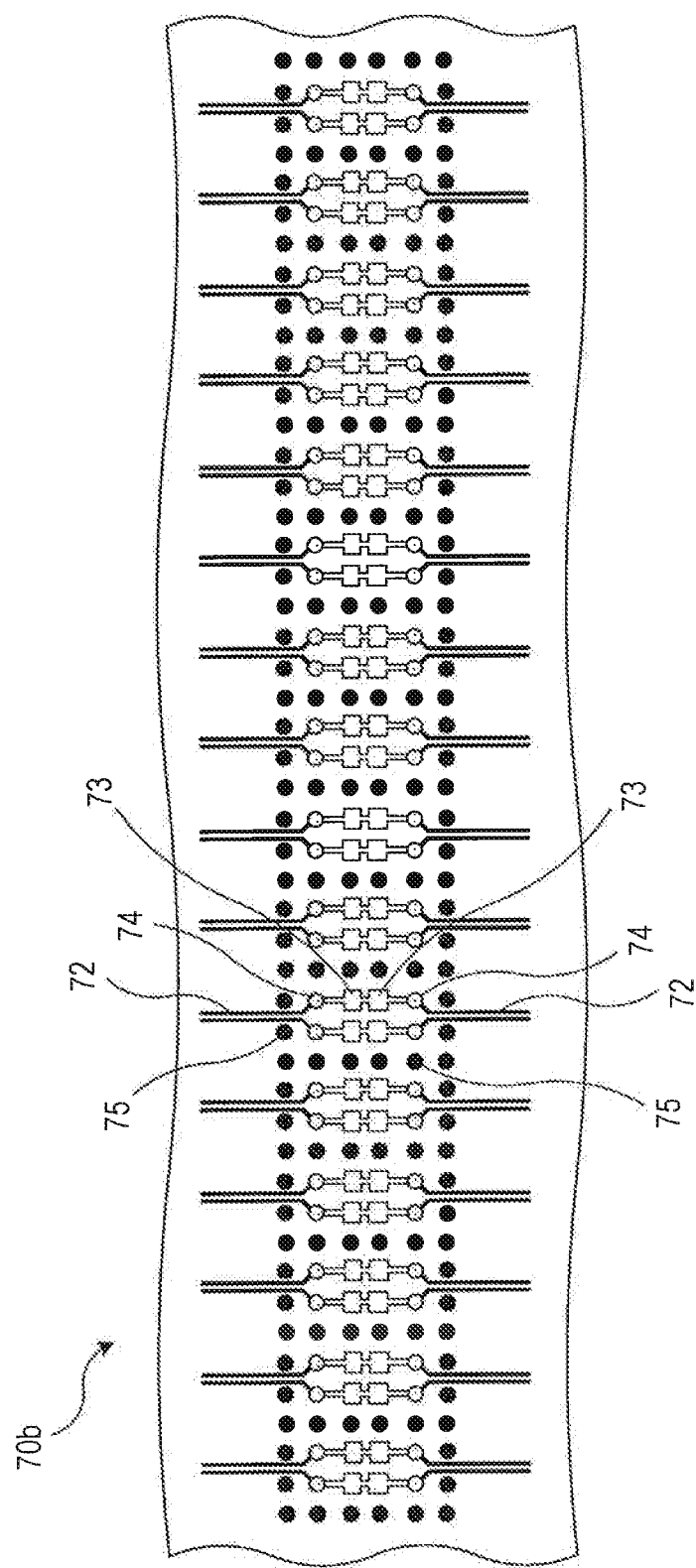
FIG. 15 is a (second) diagram illustrating an example mother board.

Each of FIG. 14 and FIG. 15 is a diagram illustrating an example mother board on which the AC coupling capacitor may be provided. A mother board 70a illustrated in FIG. 14 includes a structural portion which is provided in the middle of a single signal wire 72 through which a signal is transmitted, where the structural portion includes a pair of pad electrode portions 73 on which an AC coupling capacitor is to be mounted. Each of the signal wires 72 of the structural portion is provided within the mother board 70a and is extended to a signal electrode 74 provided on a surface of the mother board 70a through a via (not illustrated) to be electrically connected to the pad electrode portions 73. Ground electrodes 75 are disposed on the surface of the mother board 70a such that the signal electrode 74 connected to the pair of pad electrode portions 73 is interposed therebetween. The mother board 70a has a configuration in which a pair of the above-described structural portions is assumed as one group and a plurality of the groups are arranged.

In the mother board 70a including the above-described configuration, similar to the case illustrated in FIG. 3, there is a probability that crosstalk occurs on the surface of the mother board 70a because the pad electrode portions 73 and the signal electrode 74 connected to one of different pairs of signal wires 72 are located adjacent to the pad electrode portions 73 and the signal electrode 74 connected the other one of the different pairs of signal wires 72.

In order to reduce such crosstalk, on the basis of the same view as that applied to the case of FIG. 4, in a mother board 70b illustrated in FIG. 15, the ground electrodes 75 are disposed between the pad electrode portions 73 and the signal electrode 74 which are connected to one of different pairs of signal wires 72 and the pad electrode portions 73 and the signal electrode 74 which are connected to the other one of the different pairs of signal wires 72. However, in the mother board 70b having the above-described electrode arrangement, there is a probability that an area on which the AC coupling capacitor is mounted is increased and the overall size of the mother board 70b and the wire length are increased, thus resulting in increase in transmission loss.

Figure 16:
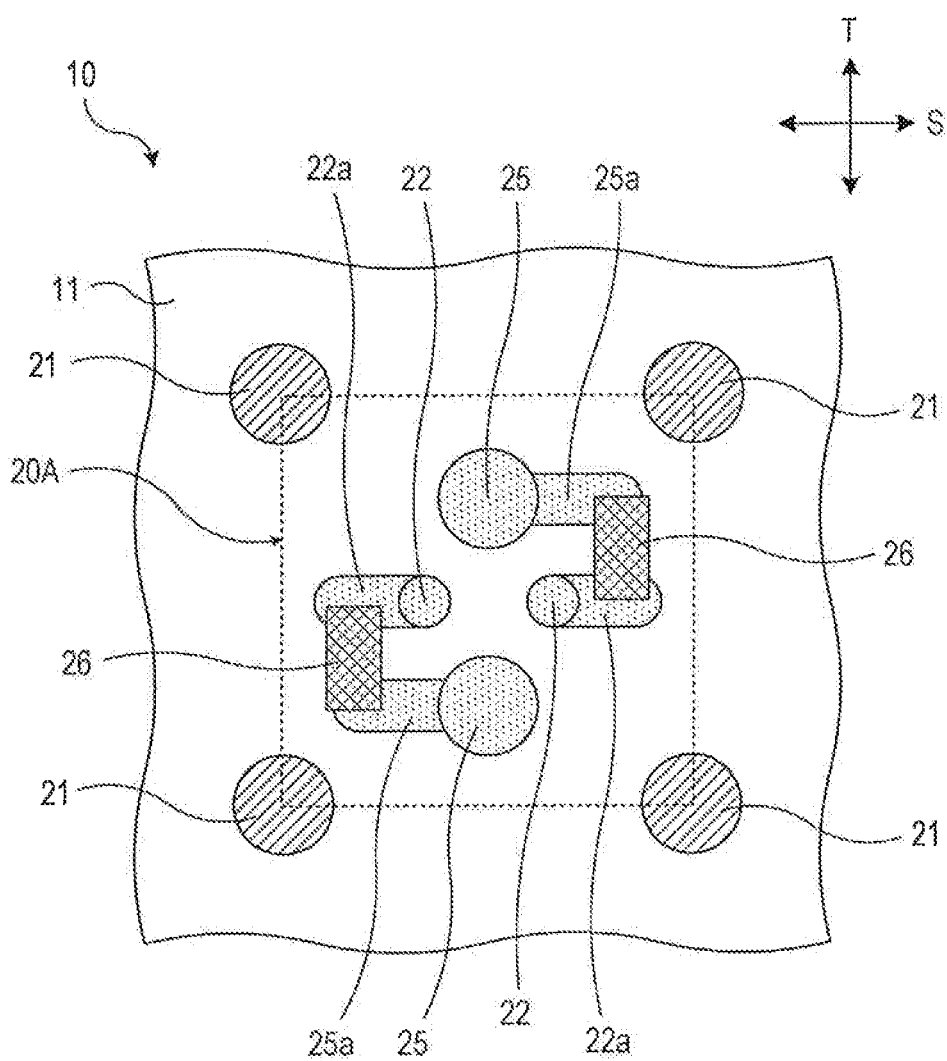
FIG. 16 is a diagram illustrating a sixth electrode arrangement example.

In view of the foregoing, an example method for mounting an AC coupling capacitor on the circuit board 10 will be described. FIG. 16 is a diagram illustrating a sixth electrode arrangement example. Specifically, FIG. 16 is a schematic view of an example electrode arrangement in an area of a circuit board.

Similar to FIG. 5, the circuit board 10 illustrated in FIG. 16 includes, on a part of the surface 11, four ground electrode 21 disposed at vertexes of a rectangular area 20A and a pair of signal electrodes 22 disposed in the rectangular area 20A (indicated by dashed lines) and surrounded by the ground electrodes 21. The pair of signal electrodes 22 is arranged in the direction S. A pad electrode portion 22a disposed on the rectangular area 20A of the surface 11 is electrically coupled to the corresponding one of the signal electrodes 22.

The circuit board 10 illustrated in FIG. 16 further includes a pair of electrode terminals 25 disposed within on the rectangular area 20A of the surface 11 so as to be arranged in the direction T. For example, the pair of electrode terminals 25 is arranged on a line passing in an intermediate point between the pair of signal electrodes 22 and extending in a perpendicular direction to the direction S (that is, on a line extending in the direction T). The interval between the pair of electrode terminals 25 is the same interval as or substantially the same interval as the interval a between the pair of signal electrodes 22. A pad electrode portion 25a disposed on the rectangular area 20A of the surface 11 is electrically coupled to the corresponding one of the electrode terminals 25. The electrode terminals 25 and the pad electrode portion 25a are arranged on the surface 11 of the circuit board 10 such that each of the electrode terminals 25 as a single body and the pad electrode portion 25a as a single body coupled thereto are electrically independent.

Each of AC coupling capacitors 26 is connected to the pad electrode portion 22a coupled to the corresponding one of the signal electrodes 22 and the pad electrode portion 25a coupled to the corresponding one of the electrode terminals 25 of the circuit board 10 illustrated in FIG. 16. Thus, the pad electrode portion 22a and the pad electrode portion 25a are connected to each other via the AC coupling capacitor 26.

Figure 17:
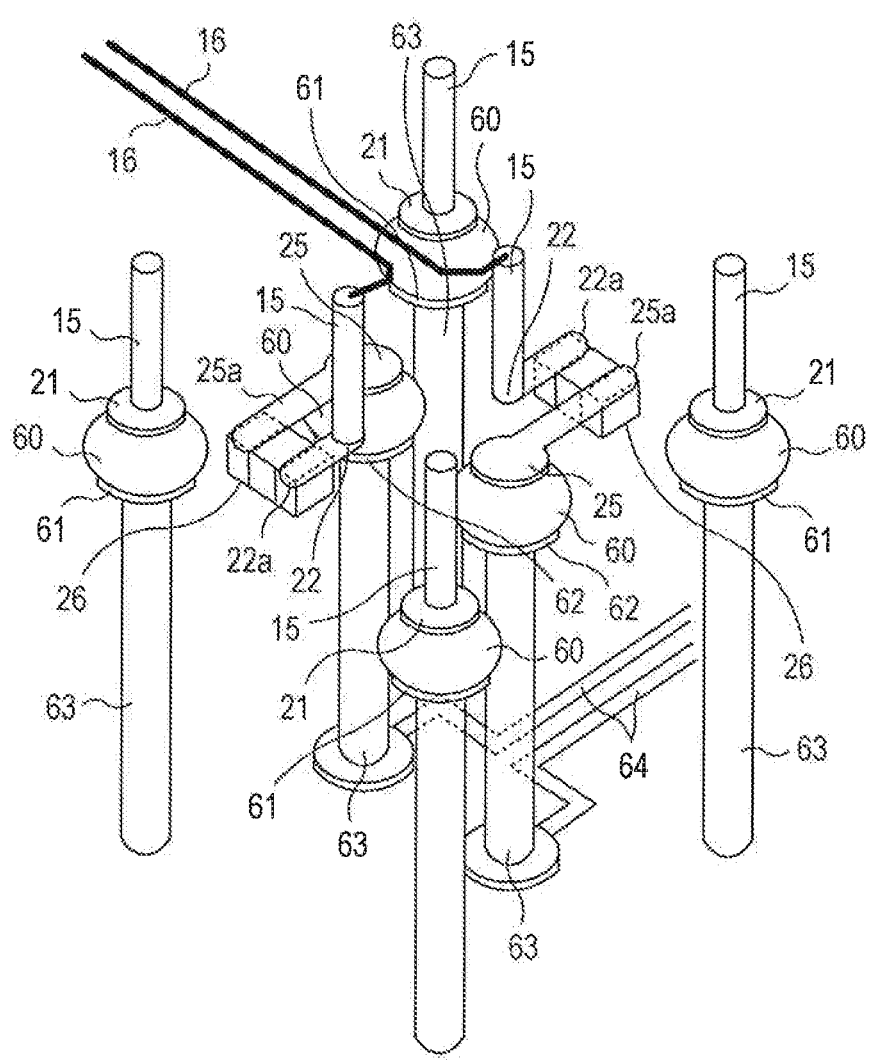
FIG. 17 is a (second) diagram illustrating an example joint part where a circuit board and a component are joined together.

The circuit board 10 including the configuration illustrated in FIG. 16 is connected to a component, such as a mother board and the like. FIG. 17 is a diagram illustrating an example joint part where a circuit board and a component are connected together. Specifically, FIG. 17 is a perspective view schematically illustrating an example joint part where a circuit board and a mother board are connected.

In FIG. 17, four ground electrodes 21 and a pair of signal electrodes 22 are provided on a surface of the circuit board 10 in the above-described electrode arrangement illustrated in FIG. 16. Each of vias 15 provided in the circuit board 10 is coupled to the corresponding one of the ground electrodes 21 and the signal electrodes 22. A pair of signal wires 16 provided in the circuit board 10 is coupled to the vias 15 coupled to the pair of signal electrodes 22. Each of the AC coupling capacitors 26 is connected to the corresponding one of the pad electrode portions 22a coupled to the corresponding one of the signal electrodes 22 and the corresponding one of the pad electrode portion 25a coupled to the corresponding one of the electrode terminals 25.

Each of the electrode terminals 25 is connected to the corresponding one of signal electrodes 62 provided on a surface of the mother board via the corresponding one of bumps 60. Similarly, each of the ground electrodes 21 is connected to the corresponding one of ground electrodes 61 provided on the surface of the mother board via the corresponding one of the bumps 60. Each of vias 63 provided in the mother board is coupled to the corresponding one of the ground electrodes 61 and the signal electrodes 62. Signal wires 64 provided in the mother board are coupled to the vias 63 electrically connected to the electrode terminals 25.

As described above, in the example of FIG. 17, each of the signal electrodes 22 electrically coupled to the corresponding one of the signal wires 16 via the corresponding one of the vias 15 is electrically coupled to the corresponding one of the electrode terminals 25 via the corresponding one of the pad electrode portion 22a, the corresponding one of the AC coupling capacitors 26 and the corresponding one of the pad electrode portions 25a. Each of the electrode terminals 25 is electrically coupled to the corresponding one of the signal electrodes 62 of the mother board via the corresponding one of the bumps 60, and each of the signal electrodes 62 is electrically coupled to the corresponding one of the signal wires 64 via the corresponding one of the vias 63. Thus, a transmission path including the AC coupling capacitor 26 in the middle of the transmission path may be achieved, and accordingly, a transmission path which suppresses low frequency noise and transmits a high frequency signal and an electronic device including the transmission path may be achieved.

The transmission paths extending from the signal electrodes 22 to the electrode terminals 25 on the surface 11 of the circuit board 10 are surrounded by the ground electrodes 21, the joint parts where the electrode terminals 25 and the signal electrodes 62 of the mother board are connected together are surrounded by the joint parts where the ground electrodes 21 of the circuit board 10 and the ground electrodes 61 of the mother board are connected together. Thus, crosstalk is reduced in an area between the circuit board 10 and the mother board.

In the electrode arrangement illustrated in FIG. 16 and FIG. 17, as compared to an electrode arrangement including a simple lattice pattern, a larger space is allowed between the pair of signal electrodes 22 arranged in the direction S and the pair of ground electrodes 21 arranged in parallel to the pair of signal electrodes 22. The space is used as an arrangement area for the AC coupling capacitor 26. For example, when it is assumed that the interval a between the signal electrodes 22 is 1 mm and the interval b between the ground electrodes 21 is 2 mm, the space has a sufficient area for disposing the AC coupling capacitor 26 having a size which has a width of 0.3 mm, a length of 0.5 mm, and a thickness of 0.2 mm.

Similar to the ground electrodes 21, the electrode terminals 25 function as electrodes used for connecting the circuit board 10 to the mother board using the bumps 60, and thus, it is preferable that the electrode terminals 25 have the same plane size or substantially the same plane size as the plane size of the ground electrodes 21. Use of the bumps 60 with the same or similar size in the plane size for both the electrode terminals 25 and the ground electrodes 21 may allow the circuit board 10 and the mother board to be connected together with a certain gap therebetween and connection failure between the circuit board 10 and the mother board may be reduced. The signal electrodes 22 function as electrodes electrically coupled to the pad electrode portion 22a to which the AC coupling capacitor 26 is connected, and therefore, the signal electrodes 22 may be formed so as to have a plane size having a diameter equal to or greater than a diameter (for example, 100 μm) of the vias 15 which connect the signal electrodes 22 to the signal wires 16.

Also, as illustrated in FIG. 17, the circuit board 10 which is to be connected to the mother board may be formed in a structure in which the electrode terminals 25 are disposed in positions of the signal electrodes 22 in FIG. 6 when the AC coupling capacitors 26 are not mounted. In the circuit board 10 of FIG. 17, the direction in which the signal electrodes 22 are arranged is a direction rotated by 90 degrees from the direction in which the signal electrodes 22 of FIG. 6 are arranged, and the signal wires 16 are electrically connected to the signal electrodes 22 thus provided. The circuit board 10 is formed to have the configuration of FIG. 17, and thus, the electrode terminals 25 may be connected to the ground electrodes 61 using the bumps 60 without changing the structure of the mother board.

Figure 18:
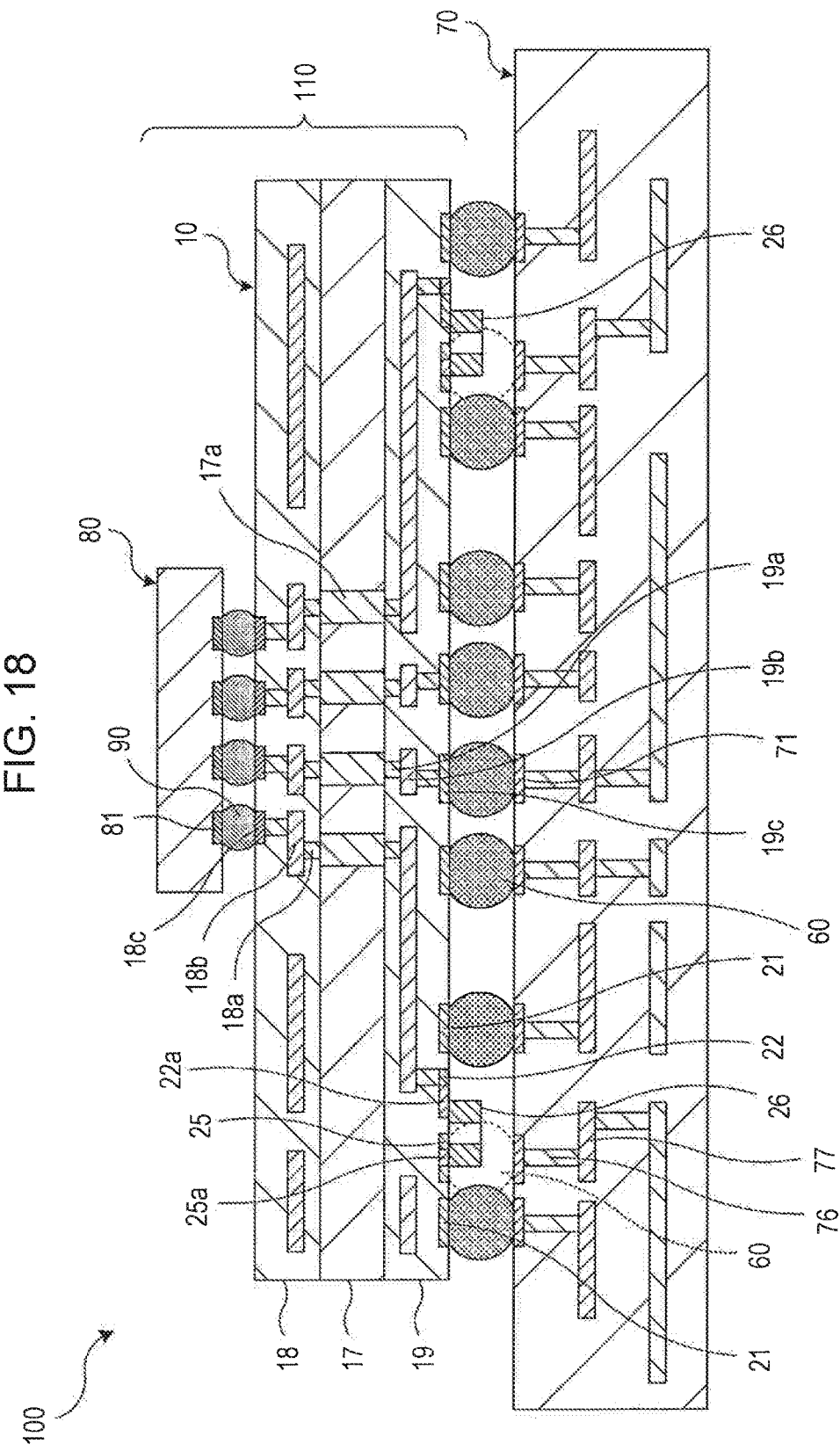
FIG. 18 is a diagram illustrating an example electronic device using a circuit board.

The electrode arrangement illustrated in FIG. 16 and FIG. 17 may be provided in each of a plurality of parts of the circuit board 10 such that multiple ones of the electrode arrangement are arranged so as to be adjacent to one another in accordance with the examples of FIGS. 7-10. FIG. 18 is a diagram illustrating an example electronic device using the above-described circuit board 10. Specifically, FIG. 18 is a cross-sectional view schematically illustrating an example of an electronic device, and for the sake of convenience, a part of electronic device illustrated in a perspective manner.

An electronic device 100 illustrated in FIG. 18 includes a circuit board 10, a semiconductor element 80 mounted on the circuit board 10, and a mother board 70 connected to the circuit board 10 on which the semiconductor element 80 is mounted. FIG. 18 illustrates a case, as an example, where the electronic device 100 includes an AC coupling capacitor 26 mounted on a joint surface of the circuit board 10 and the joint surface is coupled to the mother board 70.

The circuit board 10 is, for example, a build-up substrate including a core layer 17, and a wire layer 18 and a wire layer 19 provided on both sides of the core layer 17, respectively. Through hole vias 17a are provided in the core layer 17.

Vias 18a and wires 18b electrically coupled to the through hole vias 17a are provided in the wire layer 18, and electrodes 18c are provided in positions corresponding to electrodes 81 of the semiconductor element 80 on a surface of the wire layer 18. The electrodes 18c of the circuit board 10 are connected to the electrodes 81 of the semiconductor element 80 via bumps 90, and thus, a semiconductor package 110 is formed in which the semiconductor element 80 is mounted on the circuit board 10.

Vias 19a and wires 19b electrically coupled to the through hole vias 17a are provided in the wire layer 19, and electrodes 19c (30) are provided in positions corresponding to electrodes 71 of the mother board 70 on a central part of a surface of the wire layer 19 which faces to the mother board 70.

The ground electrodes 21, the signal electrodes 22, and the electrode terminals 25 are provided on a peripheral part of the surface of the wire layer 19 which faces the mother board 70. Each of vias 19a (15) provided in the circuit board 10 is connected to the corresponding one of the ground electrodes 21 and the signal electrodes 22, and a wire 19b provided in the circuit board 10 to serve as a signal wire (16) is connected to the via 19a connected to the signal electrode 22. The AC coupling capacitor 26 which couples the corresponding one of the pad electrode portions 22a electrically connected to the corresponding one of the signal electrodes 22 and the corresponding one of the pad electrode portions 25a electrically connected to the corresponding one of the electrode terminals 25 is provided on the wire layer 19.

The electrode terminals 25 are connected to the electrodes 71 provided on the surface of the mother board 70 via the bumps 60 (indicated by dashed lines) where the electrodes 71 serve as signal electrodes (62). Similarly, the ground electrodes 21 are connected to the electrodes 71 provided on the surface of the mother board 70 via the bumps 60 where the electrodes 71 serve as ground electrodes (61). Vias 76 and wires 77 provided in the mother board 70 are coupled to the electrodes 71. The wires 77 provided in the mother board 70 to serve as signal wires (64) are coupled to the vias 76 electrically coupled to the electrode terminals 25.

The electrodes 19c, the electrode terminals 25, and the ground electrodes 21 of the circuit board 10 on which the semiconductor element 80 is mounted are connected to the electrodes 71 of the mother board 70 via the bumps 60, and thus, the electronic device 100 in which the semiconductor package 110 is mounted on the mother board 70 is formed.

Thus, the electronic device 100 is achieved which includes a transmission path for high frequency transmission in which low frequency noise may be cut or decreased by using the circuit board 10 including the AC coupling capacitors 26 provided on the circuit board 10. In the electronic device 100, the electrode arrangement illustrated in FIG. 16 and FIG. 17 is employed for the circuit board 10, and thereby, crosstalk in the joint parts where the signal electrodes 22 and the electrodes 71 (the signal electrodes 62) are connected together via the bumps 60 may be reduced. Furthermore, the overall size of the circuit board 10 may be reduced, and the length of each wire may be reduced, and thus, transmission loss which occurs when a relatively high frequency signal is transmitted may be reduced.

Note that the above-described circuit board 10 is formed by stacking, on both surfaces of the core layer 17, the certain number of layers of sheet members on which a certain conductor pattern is formed. A substrate, such as a glass epoxy substrate and the like, having a certain stiffness is used for the core layer 17, hole opening processing using a laser or the like is performed thereon to form holes in the substrate, and conductive parts are formed in the holes, thereby forming the through hole vias 17a. For the sheet members stacked on the core layer 17, for example, resin sheets made of epoxy resin or the like, having a certain flexibility, on which a certain conductor pattern is provided, may be used. The certain number of layers of such sheet members are stacked, and thereby, the vias 18a and 19a, the wires 18b and 19b, and the electrodes 18c and electrodes 19c, as well as the ground electrodes 21, the signal electrodes 22, the electrode terminals 25, and the pad electrode portions 22a and 25a, are formed.

For the mother board 70, for example, a laminated body of prepreg with a conductor pattern provided on both of front and back surfaces thereof, or the front surface or the back surface thereof may be used. For the mother board 70, hole opening processing using a laser or the like may be performed on the certain number of layers of prepreg or a laminated body of prepreg and a conductive film may be formed in holes thus formed, thereby forming through holes which provide electrical conduction between the front and back surfaces.

Note that the electronic device 100 in which the AC coupling capacitor 26 is provided on the circuit board 10 has been described as an example in this embodiment, but a transmission path may be provided on the mother board 70 and the AC coupling capacitor 26 may be provided on the transmission path.

Also, the semiconductor package 110 in which the semiconductor element 80 is mounted on the circuit board 10 has been described as an example in this embodiment, but another component (for example, a chip component, such as an AC coupling capacitor and the like), in addition to the semiconductor element 80, may be mounted on the circuit board 10.

Furthermore, a so-called component built-in type circuit board, that is, a circuit board on which one of the above-described electrode arrangement is provided at least on a joint surface thereof with the mother board 70 and which includes a component, such as a semiconductor element and the like, provided therein, may be mounded on the mother board 70.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A circuit board comprising:
a substrate;
a first ground electrode group that includes a plurality of first ground electrodes, each of the plurality of the first ground electrodes being disposed at a corresponding one of vertexes of a first rectangular area in a surface of the substrate;
a first pair of signal electrodes disposed in the first rectangular area of the surface, the pair of the signal electrodes being arranged in a first direction parallel to a side of the first rectangular area;
a pair of electrode terminals arranged in the first rectangular area of the surface, the pair of the electrode terminals being arranged in a second direction that is perpendicular to the first direction;

a pair of first pads arranged in the first rectangular area of the surface, each first pad extending respectively from one of the signal electrodes away from the other signal electrode in the first direction;

a pair of second pads arranged in the first rectangular area of the surface, each second pad extending respectively from one of the electrode terminals in the same direction as the first pads; and a pair of capacitors provided above the surface, one end of each capacitor being coupled respectively to one of the first pads and the other end of each capacitor being coupled respectively to one of the second pads.

2. The circuit board according to claim 1, further comprising a second ground electrode group that includes a plurality of second ground electrodes, each of the plurality of the second ground electrodes being disposed at a corresponding one of vertexes of a second rectangular area, the second rectangular area being adjacent to the first rectangular area in the surface; and a second pair of signal electrodes disposed in the second rectangular area of the surface, the second pair of the signal electrodes being arranged in a second direction perpendicular to the first direction.

3. The circuit board according to claim 2, wherein a first pair of the first ground electrodes in the first ground electrode group and a second pair of the second ground electrodes in the second group electrode group are common.

4. The circuit board according to claim 1, wherein the first pair of the signal electrodes is arranged at a first pitch, and the first ground electrodes adjacent to each other are arranged at a second pitch which is the double of the first pitch.

5. The circuit board according to claim 1, wherein the first direction is a direction intersecting an end side of the substrate at an acute angle.

6. The circuit board according to claim 1, wherein the first ground electrode group of the first ground electrodes and the first pair of the signal electrodes are arranged in a peripheral part of the surface.

7. The circuit board according to claim 6, further comprising a group of electrodes arranged so as to be in a lattice pattern in a further inner area than the peripheral part in the surface.

8. The circuit board according to claim 1, further comprising a pair of wires that is provided in the substrate, a differential signal being transmitted to the pair of the wires, wherein the first pair of the signal electrodes are electrically coupled to the pair of the wires.

9. The circuit board according to claim 1, wherein the pair of the electrode terminals is arranged on a line passing in an intermediate point between the first pair of the signal electrodes and extending in a perpendicular direction to the first direction.

10. An electronic device comprising:
a first circuit board including,
a substrate,
a first ground electrode group that includes a plurality of first ground electrodes, each of the plurality of the first ground electrodes being disposed at a corresponding one of vertexes of a first rectangular area in a surface of the substrate, a first pair of signal electrodes disposed in the first rectangular area of the surface, the pair of the signal electrodes being arranged in a first direction parallel to a side of the first rectangular area, a pair of electrode terminals arranged in the first rectangular area of the surface, the pair of the electrode terminals being arranged in a second direction that is perpendicular to the first direction;

a pair of first pads arranged in the first rectangular area of the surface, each first pad extending respectively from one of the signal electrodes away from the other signal electrode in the first direction;

a pair of second pads arranged in the first rectangular area of the surface, each second pad extending respectively from one of the electrode terminals in the same direction as the first pads; and a pair of capacitors provided above the surface, one end of each capacitor being coupled respectively to one of the first pads and the other end of each capacitor being coupled respectively to one of the second pads; and an electronic component mounted on the first circuit board.

11. The electronic device according to claim 10, wherein the first circuit board further includes, a second ground electrode group that includes a plurality of second ground electrodes, each of the plurality of the second ground electrodes being disposed at a corresponding one of vertexes of a second rectangular area, the second rectangular area being adjacent to the first rectangular area in the surface; and a second pair of signal electrodes disposed in the second rectangular area of the surface, the second pair of the signal electrodes being arranged in a second direction perpendicular to the first direction.

12. The electronic device according to claim 10, wherein the first direction is a direction intersecting an end side of the substrate at an acute angle.

13. The electronic device according to claim 10, wherein the first ground electrode group of the ground electrodes and the first pair of the signal electrodes of the first circuit board are arranged in a peripheral part of the surface.

14. The electronic device according to claim 13, wherein the first circuit board further includes, a group of electrodes arranged so as to be in a lattice pattern in a further inner area than the peripheral part in the surface.

15. The electronic device according to claim 10, further comprising a second circuit board on which the first circuit board is mounted.

16. The electronic device according to claim 15, wherein each of the pair of electrode terminals is electrically coupled to the second circuit board.

* * * * *